(12) United States Patent
Joseph et al.

(10) Patent No.: US 10,304,744 B1
(45) Date of Patent: May 28, 2019

(54) INVERSE TONE DIRECT PRINT EUV LITHOGRAPHY ENABLED BY SELECTIVE MATERIAL DEPOSITION

(71) Applicant: International Business Machines Corporation, Armonk, NY (US)

(72) Inventors: Praveen Joseph, Albany, NY (US); Ekmini Anuja De Silva, Slingerlands, NY (US); Fee Li Lie, Albany, NY (US); Stuart A. Sieg, Albany, NY (US); Yann Mignot, Slingerlands, NY (US); Indira Seshadri, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/980,427

(22) Filed: May 15, 2018

(51) Int. Cl.
| | |
|---|---|
| H01L 21/00 | (2006.01) |
| H01L 21/8234 | (2006.01) |
| H01L 21/027 | (2006.01) |
| H01L 21/311 | (2006.01) |
| H01L 29/66 | (2006.01) |
| H01L 21/02 | (2006.01) |
| H01L 27/088 | (2006.01) |

(Continued)

(52) U.S. Cl.
CPC .. *H01L 21/823487* (2013.01); *H01L 21/0217* (2013.01); *H01L 21/0228* (2013.01); *H01L 21/0274* (2013.01); *H01L 21/02164* (2013.01); *H01L 21/02167* (2013.01); *H01L 21/0332* (2013.01); *H01L 21/3081* (2013.01); *H01L 21/30604* (2013.01); *H01L 21/31111* (2013.01); *H01L 21/76224* (2013.01); *H01L 21/823468* (2013.01); *H01L 21/823481* (2013.01); *H01L 27/088* (2013.01); *H01L 29/1037* (2013.01); *H01L 29/6653* (2013.01); *H01L 29/66666* (2013.01); *H01L 29/7827* (2013.01); *H01L 21/02175* (2013.01); *H01L 21/02183* (2013.01); *H01L 21/02186* (2013.01)

(58) Field of Classification Search
CPC ....... H01L 21/823481; H01L 21/02164; H01L 21/0217; H01L 21/823468; H01L 21/0228; H01L 21/02167; H01L 21/21; H01L 21/823487; H01L 21/0274; H01L 21/0332; H01L 21/30604; H01L 27/088; H01L 29/1037; H01L 21/31111
USPC ........................................................ 438/443
See application file for complete search history.

(56) References Cited

U.S. PATENT DOCUMENTS

| | | | | |
|---|---|---|---|---|
| 5,328,810 A | * | 7/1994 | Lowrey ............... | H01L 21/0271 148/DIG. 106 |
| 6,642,090 B1 | * | 11/2003 | Fried ............... | H01L 21/823828 257/E21.635 |

(Continued)

*Primary Examiner* — Luan C Thai
(74) *Attorney, Agent, or Firm* — Fleit Gibbons Gutman Bongini Bianco PL; Jose Gutman

(57) ABSTRACT

Various methods and structures for fabricating a plurality of vertical fins in a vertical fin pattern on a semiconductor substrate where the vertical fins in the vertical fin pattern are separated by wide-open spaces, along a critical dimension, in a low duty cycle of 1:5 or lower. Adjacent vertical fins in the vertical fin pattern can be all separated by respective wide-open spaces, along a critical dimension, in a low duty cycle, and wherein pairs of adjacent vertical fins in the vertical fin pattern, along the critical dimension, are separated by a constant pitch value at near zero tolerance.

14 Claims, 9 Drawing Sheets

(51) Int. Cl.
*H01L 29/78* (2006.01)
*H01L 29/10* (2006.01)
*H01L 21/306* (2006.01)
*H01L 21/308* (2006.01)
*H01L 21/762* (2006.01)
*H01L 21/033* (2006.01)

(56) References Cited

U.S. PATENT DOCUMENTS

| | | |
|---|---|---|
| 7,186,656 B2 | 3/2007 | Sreenivasan |
| 7,994,020 B2 * | 8/2011 | Lin .................... H01L 21/76232 |
| | | 257/E21.54 |
| 8,039,326 B2 * | 10/2011 | Knorr ............... H01L 21/76232 |
| | | 257/E21.63 |
| 8,431,329 B2 * | 4/2013 | Bae ....................... G03F 7/0035 |
| | | 430/270.1 |
| 9,455,194 B1 * | 9/2016 | Feng ................ H01L 21/823412 |
| 9,947,658 B2 * | 4/2018 | Wu ................... H01L 21/26513 |
| 2005/0164133 A1 | 7/2005 | Rangarajan et al. |
| 2015/0187590 A1 | 7/2015 | Ye et al. |
| 2015/0217330 A1 | 8/2015 | Haukka et al. |
| 2017/0140921 A1 | 5/2017 | Khusnatdinov et al. |
| 2017/0345643 A1 | 11/2017 | Younkin et al. |

\* cited by examiner

TABLE 1

| | EMBODIMENT 1 | EMBODIMENT 2 | EMBODIMENT 3 | EMBODIMENT 4 |
|---|---|---|---|---|
| MATERIAL1 ("MANDREL") | SILICON DIOXIDE | SILICON DIOXIDE | SILICON NITRIDE | SILICON DIOXIDE |
| SELECTIVE MANDREL SIDEWALL ALD MATERIAL | SILICON DIOXIDE | SILICON DIOXIDE | SILICON NITRIDE | SILICON DIOXIDE |
| MATERIAL2 (TRENCH-FILL MATERIAL) | SILICON NITRIDE | TRANSITION METAL OXIDES | SILICON CARBIDE | SILICON CARBIDE |
| FIN HARD MASK STACK | AMORPHOUS SILICON | SILICON NITRIDE | AMORPHOUS SILICON | AMORPHOUS SILICON |

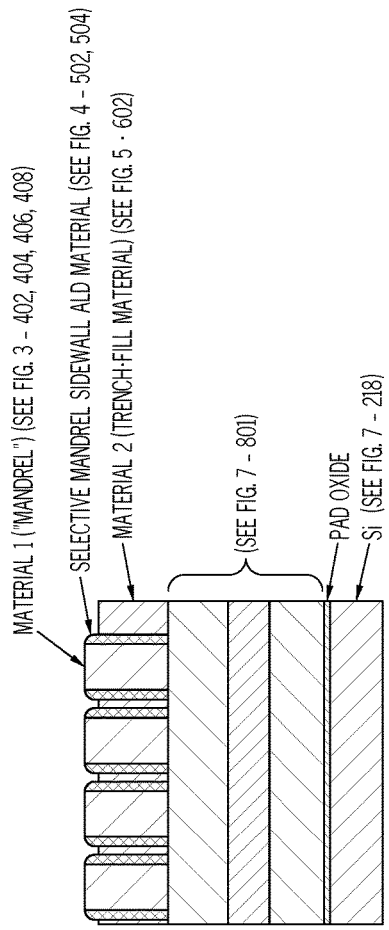

FIG. 8

INVERSE TONE DIRECT PRINT EUV LITHOGRAPHY ENABLED BY SELECTIVE MATERIAL DEPOSITION

BACKGROUND

The present invention generally relates to the field of semiconductors, and more particularly relates to a method of fabricating fin structures that form the semiconducting channel in vertical transistor structures, fin field-effect-transistor (finFET) structures, BEOL vertical metallization structures, and the like, on semiconductor chips.

Fin field-effect transistor (finFET) devices include a transistor architecture that uses raised source-to-drain channel regions, referred to as fins. A finFET device can be built on a semiconductor substrate, where a semiconductor material, such as silicon, is patterned into a fin-like shape and functions as the channel of the transistor. Known finFET devices include fins with source/drain regions on lateral sides of the fins, so that current flows in a horizontal direction (e.g., parallel to the semiconductor substrate) between source/drain regions at opposite ends of the fins in the horizontal direction.

Very recently, chip designs have started to use vertical field-effect transistors to help increase the number of transistors that can fit on a chip without having to substantially increase the overall chip size. For example, by using vertical transistor structures, it can increase the on chip finFET-equivalent density along a plane parallel to the semiconductor substrate. Vertical transport architecture FET devices include source/drain regions at ends of the fins on top and bottom sides of the fins so that current flows through the fins in a vertical direction (e.g., perpendicular to the semiconductor substrate) between a bottom source/drain region and a top source/drain region.

As chip designs continue to further miniaturize on-chip device dimensions, such designs attempt to locate vertical FETs closer and closer to each other on a semiconductor chip to enhance the feature density. The distance between a feature on a fin and the same feature on an adjacent fin is the pitch of the pattern of fins on a chip. As vertical FETs are located closer to each other, the respective fins of adjacent vertical FETs are separated from each other by smaller pitch values and tighter pitch tolerances (pitch variability), to meet chip design requirements. As pitch values between adjacent fins become smaller, conventional fabrication technologies such as 193i optical lithography concede that a single lithographic exposure (also referred to as "direct print" lithography) is not capable of providing sufficient resolution in order to meet the higher feature density requirements.

Conventional semiconductor fabrication processes have attempted to enhance the feature density by using fabrication technologies that involve multiple-patterning (or multi-patterning) such as Self-Aligned Double Patterning (SADP), and Self-Aligned Quadruple Patterning (SAQP). The minimum pitch for a single 193i optical lithographic exposure is recognized to be limited to 76 nm. SADP and SAQP techniques utilize multiple depositions and etch processes, to attempt to increase the feature density. For example, with the SAQP technique a 19 nm pitch (i.e., 76 nm divided by 4) is now accessible in principle.

Process variability in the multiple patterning processes leads to errors such as pitch-walk, which are excursions of the pitch from the nominal value. Pitch walk can also accumulate tolerance errors over multiple sequential pairs of adjacent fins.

Though state-of-the-art direct print lithography techniques (direct print lithography inherently has zero pitch walk) such as extreme ultra-violet (EUV) lithography (13.5 nm wavelength) can pattern much smaller pitches than the 76 nm achievable by 193i optical lithography, there are still some drawbacks such as the duty cycles for a given process formulation. The term "duty cycle" defines the spacing between lines (features) relative to the width of the lines (features) in the critical dimension, expressed as a ratio. Smaller duty cycles such as 1:5 (line width of 1 part to a space width of 5 parts at pitches smaller than 76 nm) are still a challenge to fabricate using any available direct print technology. That is, typical semiconductor fabrication applications have been limited to regular width lines separated by spaces of regular width that is equal to the regular width of the lines (i.e., a 1:1 duty cycle).

Therefore, the inventors have discovered that there is a need for a new fabrication method of semiconductor structures to fabricate patterns of low duty cycle (thin lines flanked by large spaces) with zero tolerance on pitch variability (pitch walk).

SUMMARY OF THE INVENTION

Various embodiments of the present invention include fabrication of vertical fins of finFET transistor devices in a vertical fin pattern on a circuit supporting substrate. The vertical fins in the vertical fin pattern on the circuit supporting substrate are separated by wide-open spaces, along a critical dimension, in a low duty cycle of 1:5 or lower. According to certain embodiments, adjacent vertical fins in the vertical fin pattern can be all separated by respective wide-open spaces, along a critical dimension, in a low duty cycle, and wherein pairs of adjacent vertical fins in the vertical fin pattern, along the critical dimension, are separated by a constant pitch value at near zero tolerance.

A method and structure, for example, can form vertical transistors, fin FET transistors, and back-end-of-line (BEOL) metallization structures, on the same chip. According to various embodiments, a method for fabricating a pattern of vertical fins in a semiconductor structure, comprises: providing a semiconductor material stack including a plurality of layers; and creating an inverse tone pattern in the semiconductor material stack, where a critical dimension of the inverse tone pattern is defined by selective sidewall atomic layer deposition to create trenches in at least one layer in the plurality of layers.

In one embodiment, a method for fabricating a pattern of vertical fins in a semiconductor structure, the method comprising: providing a semiconductor material stack including: a semiconductor substrate layer; a fin hard mask stack, including one or more layers, disposed on the semiconductor substrate layer; a first material layer, consisting of a first material, disposed on the fin hard mask stack; and a photolithography stack, including one or more layers, disposed on the first material layer; and the method including: forming an inverse tone direct print pattern on the photolithography stack; performing first vertical directional etching in the photolithography stack and in the first material layer only where layers are vertically exposed outside of the inverse tone direct print pattern; removing, after the first vertical directional etching, the photolithography stack to form a mandrel pattern in the first material layer disposed on the fin hard mask stack; performing selective sidewall spacer deposition on sidewalls of the mandrel pattern in the first material layer, to form trenches between sidewall spacers that were selectively deposited on the sidewalls of the mandrel pattern; performing selective bottom-up trench fill with a second material to fill only the trenches that were formed between sidewall spacers; performing etching to remove the mandrel and the sidewall spacers, leaving the second material disposed, in a first pattern following a pattern of the trenches that were formed between sidewall spacers, on the fin hard mask stack; performing second vertical directional etching in the fin hard mask stack and in the semiconductor substrate layer only where layers are vertically exposed outside of the first pattern of the second material disposed on the fin hard mask stack, to form vertical fins in a vertical fin pattern in the semiconductor substrate layer; and removing, after the second vertical directional etching, the second material and the fin hard mask stack, exposing the vertical fins in the vertical fin pattern formed in the semiconductor substrate layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 8 shows Table 1, illustrating examples of materials in Table 1 with reference to a cross-sectional side view of the example partial semiconductor structure shown in FIG. 5, according to an embodiment of the present invention.

DETAILED DESCRIPTION

Figure 1:
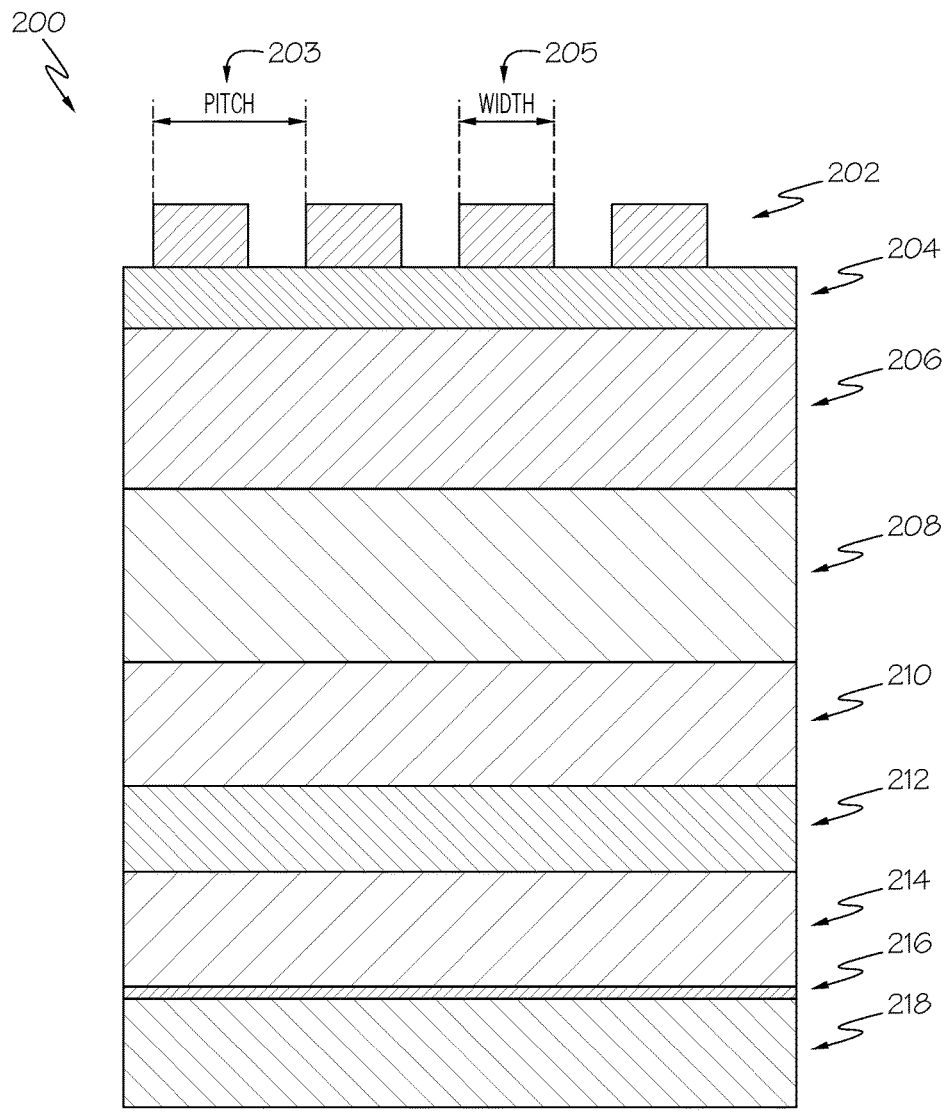
FIG. 1 is a cross-sectional side view of an example of a partial semiconductor structure illustrating a material stack that can be used in an example fabrication process, according to an embodiment of the present invention.

It is to be understood that the present invention will be described in terms of illustrative example processes for fabricating finFET semiconductor devices and vertical transistor semiconductor devices. However, other semiconductor architectures, structures, substrate materials, and process features and steps may be varied within the scope of the present invention. The terms "pitch walk", "pitch variability", "pitch tolerances", and the like, synonymously mean herein the same type of semiconductor structure metrology to determine pitch values of adjacent fin structures in a pattern of fins disposed on a semiconductor substrate. These patterns of fins may be used, for example, to fabricate fin structures for one or more of: finFET semiconductor devices, vertical transistor semiconductor devices, vertical metallization structures in the back-end-of-line (BEOL) metallization layers, and the like.

The term "duty cycle" as used herein is defined as the spacing between lines (e.g., features such as fins) relative to the width of the lines (features such as fins) in the critical dimension, expressed as a ratio. That is, for example, adjacent fins have a first width, in a critical dimension, and these adjacent fins are separated by a space having a second width, in the critical dimension. When the first width equals the second width, the duty cycle is 1:1. As a second example, when the second width (the width of the space) is twice the first width (the width of each of the adjacent fins), the duty cycle is 1:2. A duty cycle of 1:2 is smaller than a duty cycle of 1:1. The terms "small duty cycle" or "low duty cycle" synonymously mean herein a duty cycle of substantially 1:5 or smaller.

It will also be understood that when an element such as a layer, region or substrate is referred to as being "on" or "over" another element, it can be directly on the other element or intervening elements may also be present. Similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), fin field-effect transistor (finFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention can be employed in applications, hardware, and/or electronic systems. Suitable electronic hardware and systems for implementing embodiments of the invention may include, but are not limited to, personal computers, communication networks, electronic commerce systems, portable communications devices (e.g., cellular and smart phones), solid-state media storage devices, functional circuitry, etc. Systems and hardware incorporating the semiconductor devices and structures are contemplated embodiments of the invention. Given the teachings of example embodiments of the invention provided herein, one of ordinary skill in the art will be able to contemplate other implementations and applications of embodiments of the invention.

Various embodiments of the present invention can be implemented in connection with semiconductor devices, and related semiconductor fabrication processes, that may use CMOSs, MOSFETs and/or finFETs technology. By way of non-limiting example, the semiconductor devices can include, but are not limited to CMOS, MOSFET, and finFET devices, and/or semiconductor devices that use CMOS, MOSFET and/or finFET technology.

As used herein, "vertical" refers to a direction perpendicular to a substrate in the cross-sectional and three-dimensional views herein. Current between source/drain regions can be described herein as flowing in a vertical direction (e.g., between a bottom source/drain region and a top source/drain region) through a fin channel region. As used herein, "horizontal" refers to a direction parallel to a substrate in the cross-sectional and three-dimensional views herein.

As used herein, "thickness". "thick", or the like, refers to a size of an element (e.g., a layer, trench, hole, etc.) in the cross-sectional views measured from a bottom surface to a top surface, or from a left side surface to a right side surface of the element, and/or measured with respect to a surface directly adjacent to and contacting the element (e.g., a surface on which the element is directly disposed on).

Unless otherwise specified, as used herein, "height" or "height above a substrate" refers to a vertical size of an element (e.g., a layer, trench, hole, etc.) in the cross-sectional views measured from a top surface of the substrate to a top surface of the element. A thickness of an element can be equal to a height of the element if the element is directly on the substrate.

As used herein, the terms "lateral," "lateral side," "lateral surface" refer to a side surface of an element (e.g., a layer, opening, etc.), such as a left or right side surface in the cross-sectional views herein.

As used herein, the terms "pitch" or "pitch value", and the like, refer to a distance from a point on a first fin structure to a corresponding point on a second fin, in a pattern of fin structures disposed on a semiconductor substrate. The points of reference may be located at a start point, at a center point, or at an endpoint, of a fin structure and a corresponding adjacent fin structure. For example, with reference to FIG. 1, a pitch value 203 can be measured from a start point of a first structure to a start point of an adjacent second structure. Pitch value measurements can be taken between the first and second structures, between the second and a third structure, between the third and a fourth structure, and so forth. Additionally, the terms "width" or "width value", and the like, refer to a distance from a start point on a first structure to an end point on the same structure, in a critical dimension. For example, with reference to FIG. 1, a width value 205 can be measured from a start point on a structure to an end point on the same structure, in a critical dimension.

Various embodiments of the present invention include a plurality of fins on the same semiconductor substrate on a wafer. This structure may be used, for example, to create CMOS devices in an integrated circuit.

Referring now to the drawings in which like numerals represent the same or similar elements, FIG. 1 shows an example of a material stack 202, 204, 206, 208, 210, 212, 214, 216, 218, suitable for fabrication of a plurality of vertical finFET devices. A semiconductor substrate layer 218, for example, comprises silicon. However, other semiconductor materials may be used according to various embodiments of the present invention. A pad oxide layer 216 is disposed on the silicon layer silicon layer 218, according to the present example. The pad oxide layer 216, for example, is approximately 30 Å thick.

A fin hard mask stack 210, 212, 214, is disposed on the pad oxide layer 216. The fin hard mask stack, according to the example, comprises a silicon nitride layer 210, optionally disposed on one or more layers 212, 214. Additionally, while the present example fin hard mask stack 210, 212, 214, includes three layers of the same material or of different materials, certain embodiments can include a different number of layers of a fin hard mask stack. For example, a fin hard mask stack could include four layers of the same material or of different materials.

A first material layer 208 is disposed on top of the fin hard mask stack, e.g., disposed on the first silicon nitride layer 210 according to the present example. The first material 208, in this example, comprises silicon dioxide. It should be noted that the first material 208, according to certain embodiments, could be a material other than silicon dioxide. For example, in one embodiment the first material 208 could be silicon nitride.

A photolithography stack 202, 204, 206, is disposed on top of the first material layer 208. The photolithography stack 202, 204, 206, may include one or more layers. For example, a photolithography stack may include, in certain embodiments, a first photolithography layer (photoresist layer) 202 disposed directly on a second photolithography layer comprising SiARC (silicon containing anti-reflective coating) 204 which is disposed directly on a third photolithography layer comprising OPL (optical planarizing layer) 206.

An inverse tone direct print pattern is formed on the inverse tone direct print layer (photoresist layer) 202. Inverse tone lithography is a direct print lithography process that, according to one example, may use extreme ultraviolet light (EUV). The direct print lithography process can be, for example, any one of extreme ultra-violet lithography, 193i optical lithography, electron-beam lithography, or nanoimprint lithography.

In the final structure, it would be desirable to have element (line) widths as small as possible (thin lines) while increasing the spacing (wide-open spaces) between the elements (lines). However, such types of structures with low duty cycles, e.g., a duty cycle of 1:5 or lower, normally cannot be created using a direct print lithography process. Direct print lithography processes are typically used to create structures at, or close to, a 1:1 duty cycle.

Figure 2:
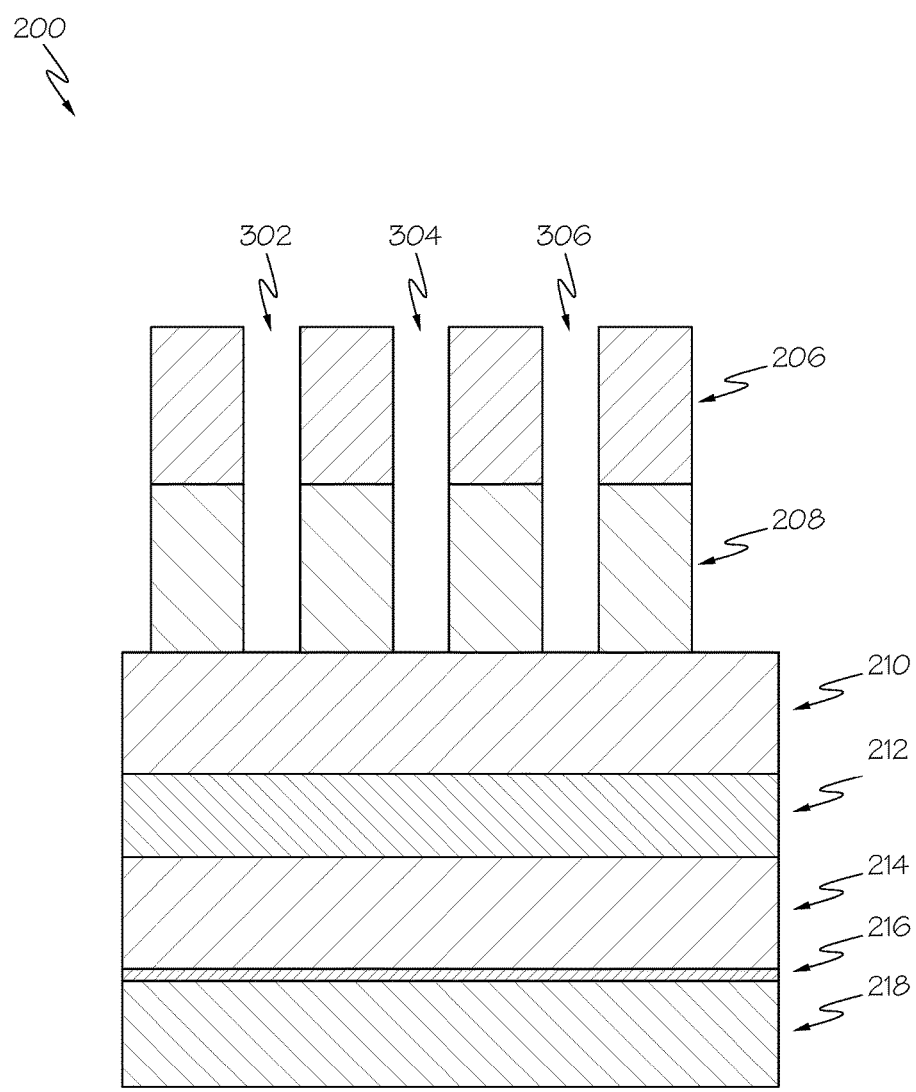
FIG. 2 is a cross-sectional side view of the partial semiconductor structure of FIG. 1 at a point in the example fabrication process following patterning and etching of the material stack, such as for fabricating finFET semiconductor devices, according to an embodiment of the present invention.
Figure 3:
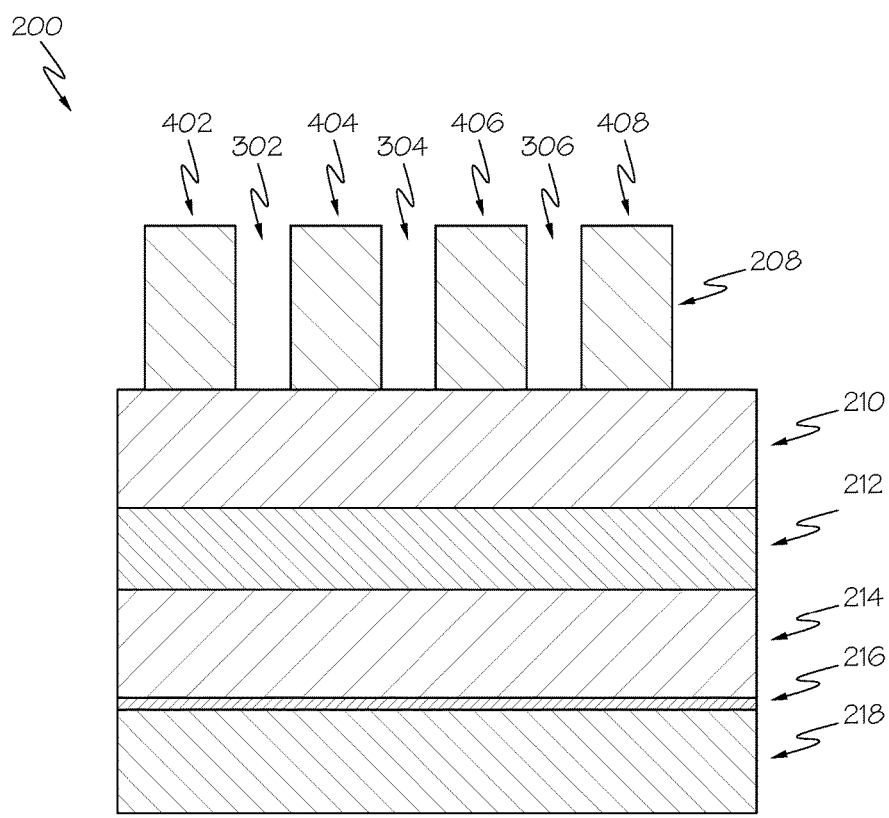
FIG. 3 is a cross-sectional side view of the partial semiconductor structure of FIG. 2 at a point in the example fabrication process following removal of a portion of the material stack and formation of a mandrel pattern on top of the remaining material stack.

Referring to FIG. 2, a fabrication process performs a first vertical directional etch in the photolithography stack layers 204, 206, and in the first material layer 208. An example of a vertical directional etching process that etches into layer 204 is reactive ion etching (RIE) using a fluoride based chemistry. The first vertical directional etching step vertically etches only where the layers 204, 206, 208, are vertically exposed outside of the inverse tone direct print pattern in the inverse tone direct print pattern layer (photoresist layer) 202. The structure is achieved by dry etching layer 204 using layer 202 as the mask using a fluoride based chemistry. The layer 206 is etched using layers 202 and 204 as masks using an oxygen or nitrogen/hydrogen or hydrogen bromide based chemistry. During this etching process, layer 202 is removed. Then layer 208 is etched using layers 204 and 206 as masks using a fluoride chemistry while simultaneously removing layer 204. After the first vertical directional etching, the remaining layer of the photolithography stack (OPL layer) 206, is removed from the etched first material layer 208 by using a dry etch process such as an oxygen plasma, as shown in FIG. 3. In another instance, material (OPL) 206 can be removed by using a suitable wet-etchant.

Figure 4:
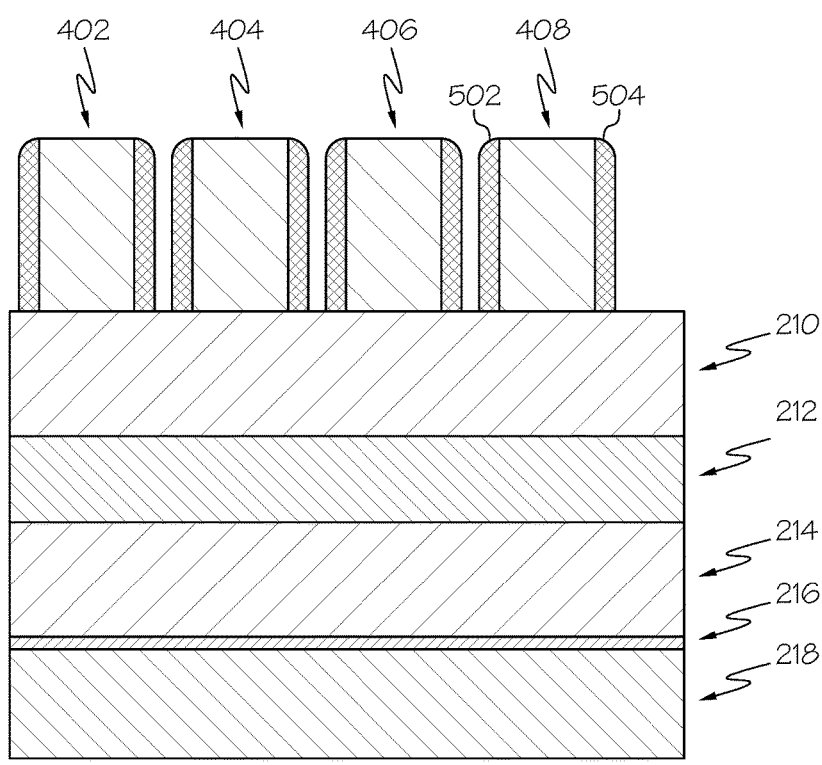
FIG. 4 is a cross-sectional side view of the partial semiconductor structure of FIG. 3 at a point in the example fabrication process following selective sidewall spacers deposition on the sidewalls of the mandrel pattern and defining trenches with the spacers, according to an embodiment of the present invention.

The etched first material layer 208 comprises a mandrel pattern 402, 404, 406, 408, with trenches 302, 304, 306, located where the first material layer 208 was etched. The semiconductor fabrication process continues, with reference to FIG. 4, by performing selective sidewall spacer deposition on sidewalls of the mandrel pattern 402, 404, 406, 408. This can be done using a selective atomic layer deposition (ALD) process that deposits material only on materials 402, 404, 406, 408 and not on the exposed material 210 in the trenches 302, 304, 306. Sidewall spacers 502, 504, are formed on the sidewalls of all of the mandrel pattern 402, 404, 406, 408, without depositing sidewall spacer material at the bottom of the trenches 302, 304, 306, and without depositing sidewall spacer material on top of the first material 208 of the mandrel pattern 402, 404, 406, 408. After the selective sidewall spacer deposition on the sidewalls of the mandrel pattern, there remain gaps in the trenches 302, 304, 306, between the sidewall spacers 502, 504, formed on the sidewalls of all of the mandrel pattern. These gaps are narrow trenches between the sidewall spacers 502, 504.

Figure 5:
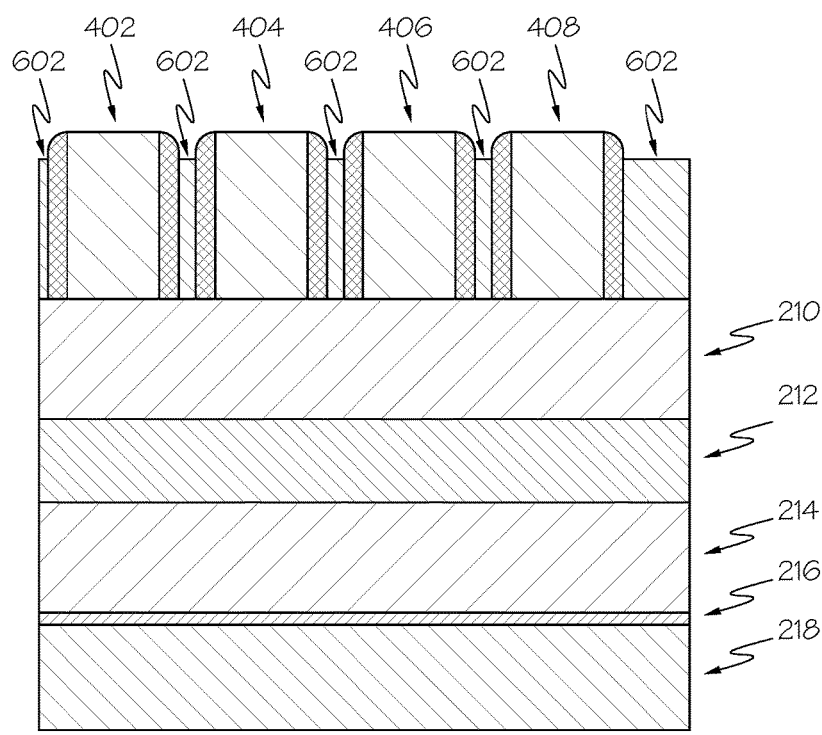
FIG. 5 is a cross-sectional side view of the partial semiconductor structure of FIG. 4 at a point in the example fabrication process following selective material deposition in the trenches, according to an embodiment of the present invention.

Referring to FIG. 5, the semiconductor fabrication process continues by performing selective bottom-up trench fill with a second material 602 that fills only the narrow trenches that were formed between the sidewall spacers 502, 504. The second material 602, according to the example, comprises Transition Metal Oxides. It should be noted that other types of materials may be used in the second material 602, according to various embodiments of the present invention. In the selective bottom-up trench fill process, the second material 602 is not deposited on top of the mandrel pattern (comprising the first material) 402, 404, 406, 408. The second material 602 selectively fills the narrow trenches (e.g., the second material 602 grows and deposits only in the narrow trenches) from the bottom of the trenches by using a cyclical bottom up trench fill process. In this cyclical trench fill process, a layer of the second material 602 is selectively grown at the bottom of the narrow trenches. The layer of the second material 602 is then vertically directionally etched and leveled from spacer to spacer 502, 504, inside the narrow trenches. This cyclical trench fill process is repeated by selectively growing another layer of the second material 602 on top of the second material 602 previously deposited in the narrow trenches, until the narrow trenches are filled with the second material 602 to a desired level. By controlling the number of cycles used to grow the second material 602 in the narrow trenches, it in turn controls the thickness of the second material 602 in the narrow trenches.

An alternative fabrication process to the above described selective bottom-up trench fill process, would fill up the narrow trench using a deposition technique such as atomic layer deposition (ALD) of a "thin coat material" used to fill up the trench, or by using chemical vapor deposition (CVD) to fill up the trench. This deposition of the second material in the narrow trench may result in an overflow of the second material above the trench. In such a case, a planarization such as by a chemical and mechanical polishing (CMP) step or an etching step can be used to bring the level of the second material down to only fill the trench.

Figure 6:
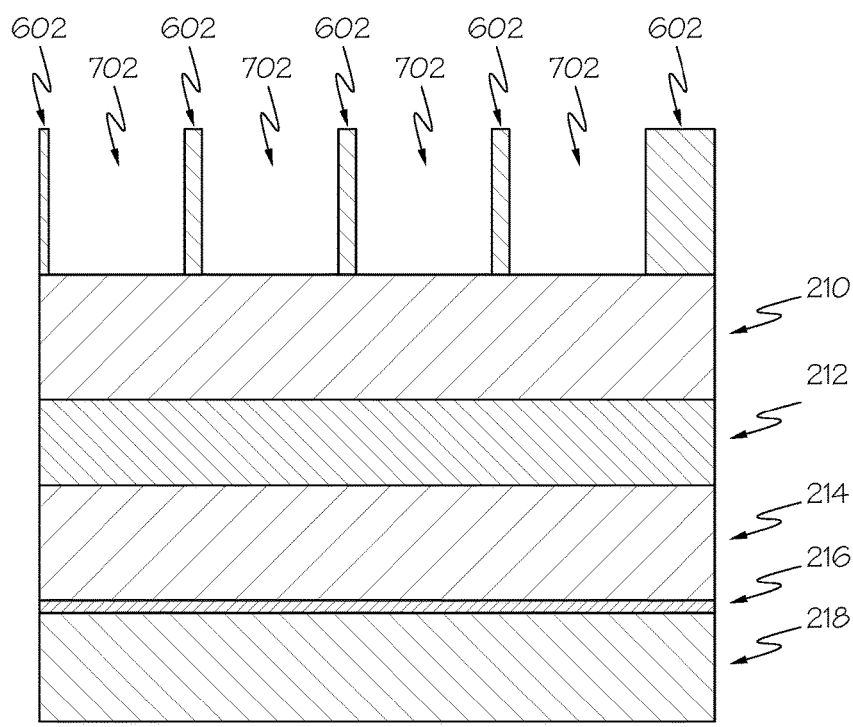
FIG. 6 is a cross-sectional side view of the partial semiconductor structure of FIG. 5 at a point in the example fabrication process following etching removal of the mandrel pattern and the spacers, leaving an inverse tone pattern of the material deposited in the trenches in FIG. 5 on top of the remaining material stack, according to an embodiment of the present invention.

The semiconductor fabrication process then continues, with reference to FIG. 6, by performing an etching process to remove the mandrel layer 208 including removal of the sidewall spacers 502, 504. For example, a wet or dry etch process can be used to remove the first material 208 and the spacers 502, 504, deposited on it. This etching process leaves a first pattern of wide-open spaces 702 between thin lines 602 comprising the second material 602. The thin lines 602 made of the second material, and separated by the wide-open spaces 702, are disposed on top of the fin hard mask stack 210, 212, 214. It should be noted that the first pattern of the second material 602 is an inverse tone pattern of the pattern of the mandrel 402, 404, 406, 408, and the sidewall spacers 502, 504, shown in FIG. 4. That is, the pattern of the second material 602 shown in FIG. 6 is the inverse of the pattern of the mandrel 402, 404, 406, 408, and sidewall spacers 502, 504, shown in FIG. 4. A suitable wet etch process that is selective to material 602 is used to etch materials 402, 404, 406, 408 along with the side wall spacers 502, 504.

Figure 7:
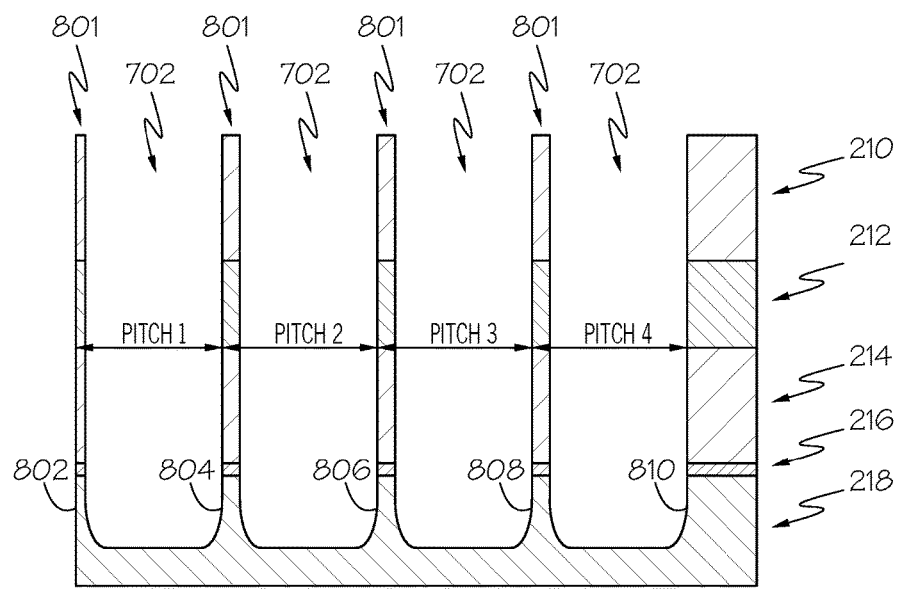
FIG. 7 is a cross-sectional side view of the partial semiconductor structure of FIG. 6 at a point in the example fabrication process following etching removal of a portion of the remaining material stack to form a pattern of fins on the semiconductor substrate, according to an embodiment of the present invention.

With reference to FIG. 7, a second vertical directional etching is performed in the fin hard mask stack 210, 212, 214, and in the oxide pad layer 216 and the semiconductor substrate layer 218. An example of a vertical directional etching process is reactive ion etching (RIE). This second vertical directional etching removes material from the layers 210, 212, 214, 216, 218, only where the layers 210, 212, 214, 216, 218, are vertically exposed outside of the first pattern of the second material 208, disposed on the fin hard mask stack 210, 212, 214. The second material 602 is then removed leaving the fin hard mask stacks 801 on fin structures 802, 804, 806, 808. Wide-open spaces 702 have been formed between the fins 802, 804, 806. 808. The width of the spaces 702, along a critical dimension, is much greater than the width of the lines (fins 802, 804, 806. 808), also along the critical dimension, resulting in a low duty cycle of 1:5 or lower. As a subsequent step in this semiconductor fabrication process, the fin hard mask stack 210, 212, 214, and the pad oxide 216, are removed by etching. A suitable wet etch process that is selective to the silicon substrate (218) is used to etch the fin hard mask stack 801.

The fins 802, 804, 806. 808, in the semiconductor substrate layer 218 provide the structure for fabricating, for example, vertical transistors, finFETs, and vertical metallization in a BEOL stack of one or more layers of metallization. Additionally, because direct print photolithography is used in this semiconductor fabrication process the pitch of the fins 802, 804, 806, 808, in a pattern on the substrate 218 can be designed and fabricated to a near zero tolerance (near zero variability). That is, for example, a first pitch between a first fin 802 and a second fin 804, along a critical dimension, is equal to (or nearly equal to within negligible tolerances of lower than 0.1 nm) a second pitch between the second fin 804 and a third fin 806, along the critical dimension. This second pitch is equal to a third pitch between the third fin 806 and a fourth fin 808, along the critical dimension. This third pitch is equal to a fourth pitch between the fourth fin 808 and a subsequent structure 810, along the critical dimension.

A semiconductor structure design, according to an embodiment of the present invention, has a significant advantage of providing a combination of low duty cycle (i.e., a duty cycle of 1:5 or lower) with a fin pattern 802, 804, 806, 808, having zero pitch walk (or nearly zero pitch walk within negligible tolerances of lower than 0.1 nm). By nearly zero pitch walk within negligible tolerances, it is intended to mean that the variability in pitch between pairs of fins along a critical dimension will be zero or a variability that is of no consequence to a design relying on zero pitch walk. For example, and not for limitation, a low duty cycle with zero pitch walk (e.g., pitch variability) design could be fabricated to a maximum tolerance of less than one tenth of a nanometer. This new semiconductor structure design and associated fabrication methods for direct print patterning of low duty cycle structures, as discussed herein, have not been possible until the present invention.

FIG. 8 shows Table 1 which provides various examples of the first material 208, the sidewall spacer material 502, 504, the second material 602, and the fin hard mask stack material 210, 212, 214, according to four example embodiments of the present invention.

According to a first embodiment, the first material 208, 402, 404, 406, 408, and the sidewall spacer material 502, 504, are both silicon dioxide. The second material is silicon nitride. The top layer 210 of the fin hard mask stack includes amorphous silicon.

According to a second embodiment, the first material 208, 402, 404, 406, 408, and the sidewall spacer material 502, 504, are both silicon dioxide. The second material is transition metal oxides. The transition metal may be any one of titanium, tantalum, or tungsten. The top layer 210 of the fin hard mask stack includes silicon nitride.

According to a third embodiment, the first material 208, 402, 404, 406, 408, and the sidewall spacer material 502, 504, are both silicon dioxide. The second material is silicon carbide. The top layer 210 of the fin hard mask stack includes amorphous silicon.

According to a fourth embodiment, the first material 208, 402, 404, 406, 408, and the sidewall spacer material 502, 504, are both silicon dioxide. The second material is silicon carbide. The top layer 210 of the fin hard mask stack includes amorphous silicon.

The above discussed fabrication process can be applied to any semiconductor structure that utilizes very thin lines and wide open spaces between adjacent lines. One example is finFET transistors. A second example is vertical transistors, which could be FETs. A third example is vertical metal inter-connects in a back end of the line (BEOL) metallization stack.

According to one example fabrication process for manufacturing vertical transistors, after the fins 802, 804, 806, 808, separated by wide open spaces 702, are formed, as shown in FIG. 7, the fin hard mask 201, 212, 214, and pad oxide 216, would be removed using a form of etch, either a dry etch or wet etch. Following that, epitaxy would be used to form the bottom source/drain contacts in the trench 702. In the wide open spaces epitaxy would be used to form the bottom source/drain. On top of that, a gate dielectric material would be deposited which would wrap around the silicon fins 802, 804, 806, 808. On top of that, gate metal would be deposited which would wrap around the gate dielectric. On top of that another epitaxy step would be conducted which would form the top source/drain of the vertical transistor. This would result in fabrication of vertical transistor structures using the fins 802, 804, 806, 808.

Figure 9:
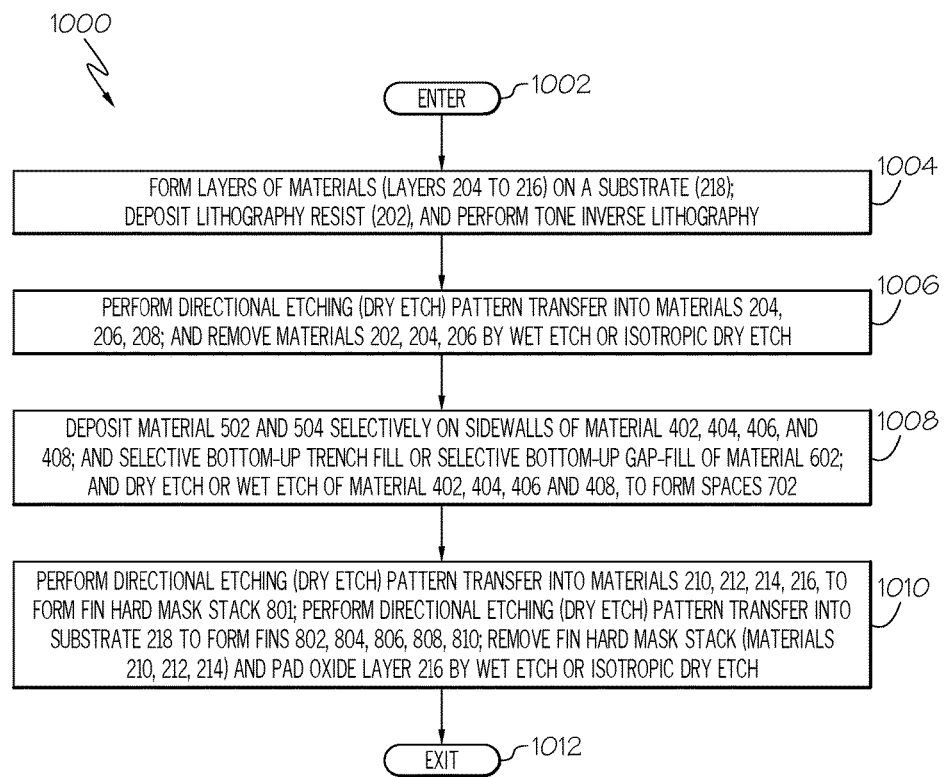
FIG. 9 is an operational flow diagram illustrating an example process for fabricating vertical finFET devices on a circuit supporting substrate, according to an embodiment of the present invention.

FIG. 9 illustrates an example method 1000 for fabricating vertical transistor devices on the same chip. Various embodiments of the invention may include some, and not necessarily all, of the method steps in the illustrated example.

The method enters, at step 1002, and immediately proceeds, at step 10004, to form layers of materials (layers 204 to 216) on a substrate (218); and then deposit lithography resist (202), and perform tone inverse lithography on a material stack 204, 206, 208, as has been discussed above. The tone inverse lithography is a direct print lithography process using extreme ultraviolet light (EUV).

The method then proceeds, at step 1006, to perform vertical directional etching (dry etch) pattern transfer into materials 204, 206, 208; and then remove materials 202, 204, 206 by wet etch or isotropic dry etch.

The method then, at step 1008, deposits spacer material 502 and 504 selectively on sidewalls of the first material 208 and mandrel 402, 404, 406, and 408. This selective deposition can be done using an ALD process. The method then performs selective bottom-up trench fill or selective bottom-up gap-fill of material 602; and then performs a dry etch or wet etch of material 402, 404, 406 and 408, to form wide spaces 702.

The method, at step 1010, performs vertical directional etching (dry etch) pattern transfer into materials 210, 212, 214, 216, to form fin hard mask stacks 801; and then performs vertical directional etching (dry etch) pattern transfer into the substrate 218 to form fins 802, 804, 806, 808, 810. The method then removes the fin hard mask stack (materials 210, 212, 214) and the pad oxide layer 216, by wet etch or isotropic dry etch. The method then exits, at step 1012. The fins 802, 804, 806, 808, 810, are formed in the semiconductor substrate 218, according to the example fabrication process, in a pattern that provides a combination of low duty cycle (i.e., a duty cycle of 1:5 or lower) with a fin pattern 802, 804, 806, 808, having zero pitch walk (or nearly zero pitch walk within negligible tolerances).

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for fabricating a pattern of vertical fins in a semiconductor structure, the method comprising:
    providing a semiconductor material stack including:
        a semiconductor substrate layer;
        a fin hard mask stack, including one or more layers, disposed on the semiconductor substrate layer;
        a first material layer, consisting of a first material, disposed on the fin hard mask stack; and
        a photolithography stack, including one or more layers, disposed on the first material layer;
    forming an inverse tone direct print pattern on a top layer of the photolithography stack;
    performing first vertical directional etching in the photolithography stack and in the first material layer only where layers are vertically exposed outside of the inverse tone direct print pattern;
    removing, after the first vertical directional etching, the photolithography stack to form a mandrel pattern in the first material layer disposed on the fin hard mask stack;
    performing selective sidewall spacer deposition on sidewalls of the mandrel pattern in the first material layer, to form trenches between sidewall spacers that were selectively deposited on the sidewalls of the mandrel pattern;
    performing selective bottom-up trench fill with a second material to fill only the trenches that were formed between sidewall spacers;
    performing etching to remove the mandrel and the sidewall spacers, leaving the second material disposed, in a first pattern following a pattern of the trenches that were formed between sidewall spacers, on the fin hard mask stack;
    performing second vertical directional etching in the fin hard mask stack and in the semiconductor substrate layer only where layers are vertically exposed outside of the first pattern of the second material disposed on the fin hard mask stack, to form vertical fins in a vertical fin pattern in the semiconductor substrate layer; and
    removing, after the second vertical directional etching, the second material and the fin hard mask stack, exposing the vertical fins in the vertical fin pattern formed in the semiconductor substrate layer.

2. The method of claim 1, wherein the inverse tone direct print pattern is formed on the photolithography stack by a direct print lithography process, wherein the direct print lithography process is one of extreme ultra-violet lithography, 193i optical lithography, electron-beam lithography, or nanoimprint lithography.

3. The method of claim 1, wherein the first material comprises silicon dioxide and the second material comprises silicon nitride.

4. The method of claim 3, wherein the sidewall spacers on the sidewalls of the mandrel pattern in the first material layer comprise silicon dioxide.

5. The method of claim 3, wherein the fin hard mask stack comprises four layers including an amorphous silicon layer disposed directly on a silicon nitride layer, which is disposed directly on a silicon dioxide layer, and which is disposed directly on a silicon nitride layer.

6. The method of claim 1, wherein the vertical fins in the vertical fin pattern are separated by wide-open spaces, along a critical dimension, in a low duty cycle of 1:5 or lower.

7. The method of claim 1, wherein adjacent vertical fins in the vertical fin pattern are all separated by respective wide-open spaces, along a critical dimension, in a low duty cycle, and wherein pairs of adjacent vertical fins in the vertical fin pattern, along the critical dimension, are separated by a constant pitch value at near zero tolerance.

8. A method for fabricating a pattern of vertical fins in a semiconductor structure, the method comprising:
    providing a semiconductor material stack including a plurality of layers; and
    creating an inverse tone direct print pattern in the semiconductor material stack, where a critical dimension of the inverse tone direct print pattern is defined by selective sidewall atomic layer deposition to create trenches in at least one layer in the plurality of layers, wherein the semiconductor material stack includes:
        a semiconductor substrate layer;
        a fin hard mask stack including one or more layers, disposed on the semiconductor substrate layer;
        a first material layer, consisting of a first material, disposed on the fin hard mask stack; and
        a photolithography stack including one or more layers, disposed on the first material layer;

forming an inverse tone direct print pattern on a top layer of the photolithography stack using direct print lithography;

performing a first vertical directional etching in the photolithography stack and in the first material layer to form a mandrel pattern in the first material layer; and performing selective sidewall atomic layer deposition to create sidewall spacers on sidewalls of the mandrel pattern disposed on the fin hard mask stack;

performing selective bottom-up trench fill with a second material to fill only trenches that were formed between the sidewall spacers on sidewalls of the mandrel pattern;

performing etching to remove the first material, the mandrel pattern, and the sidewall spacers, leaving the second material disposed, in a first pattern following a pattern of the trenches that were formed between the sidewall spacers, on the fin hard mask stack;

performing second vertical directional etching in the fin hard mask stack and in the semiconductor substrate layer only where layers are vertically exposed outside of the first pattern of the second material disposed on the fin hard mask stack, to form vertical fins in a vertical fin pattern in the semiconductor substrate layer; and removing, after the second vertical directional etching, the second material and the fin hard mask stack, exposing the vertical fins in the vertical fin pattern formed in the semiconductor substrate layer.

9. The method of claim 8, wherein the first material comprises silicon dioxide and the second material comprises transition metal oxides.

10. The method of claim 9, wherein the transition metal is one of titanium, tantalum, or tungsten.

11. The method of claim 10, wherein the sidewall spacers on the sidewalls of the mandrel pattern in the first material layer comprise silicon dioxide.

12. The method of claim 10, wherein the fin hard mask stack comprises three layers including a silicon nitride layer disposed directly on a silicon dioxide layer, and which is disposed directly on a silicon nitride layer.

13. The method of claim 10, wherein the vertical fins in the vertical fin pattern are separated by wide-open spaces, along a critical dimension, in a low duty cycle of 1:5 or lower.

14. The method of claim 10, wherein the vertical fins in the vertical fin pattern are separated by wide-open spaces, along a critical dimension, in a low duty cycle, and wherein pairs of adjacent vertical fins in the vertical fin pattern, along the critical dimension, are separated by a constant pitch value at near zero tolerance.

* * * * *